United States Patent
Cheng et al.

(10) Patent No.: US 8,332,728 B2
(45) Date of Patent: Dec. 11, 2012

(54) METHOD AND APPARATUS OF GENERATING A SOFT VALUE FOR A MEMORY DEVICE

(75) Inventors: Chuang Cheng, Hsinchu (TW); Chin-Jung Su, Hsinchu (TW)

(73) Assignee: Skymedi Corporation, Hsinchu ( * ) Notice: Subject to any disclaimer, the term of this patent is extended or adjusted under 35 U.S.C. 154(b) by 420 days.

(21) Appl. No.: 12/753,746

(22) Filed: Apr. 2, 2010

(65) Prior Publication Data
US 2011/0246855 A1 Oct. 6, 2011

(51) Int. Cl.
*G06F 11/00* (2006.01)
(52) U.S. Cl. ........................ 714/773; 714/780
(58) Field of Classification Search .................. 714/759, 714/763, 773, 780
See application file for complete search history.

(56) References Cited

U.S. PATENT DOCUMENTS

| | | | |
|---|---|---|---|
| 2009/0024905 A1* | 1/2009 | Shalvi et al. | 714/773 |
| 2009/0144600 A1* | 6/2009 | Perlmutter et al. | 714/763 |
| 2011/0131473 A1* | 6/2011 | Mokhlesi et al. | 714/773 |
| 2011/0167305 A1* | 7/2011 | Haratsch et al. | 714/42 |
| 2011/0246859 A1* | 10/2011 | Haratsch et al. | 714/773 |
| 2012/0079354 A1* | 3/2012 | Uchikawa et al. | 714/773 |

* cited by examiner

*Primary Examiner* — Marc Duncan
(74) *Attorney, Agent, or Firm* — Huffman Law Group, P.C.

(57) ABSTRACT

A method and apparatus of generating the soft value for a memory device is disclosed. Memory read-related parameters are set, and data are read out of the memory device according to the set parameters. The data reading is performed for pre-determined plural iterations, thereby obtaining the soft value according to the read-out data and the set parameters.

54 Claims, 15 Drawing Sheets

| Parameter | Read-out data | Update value |
|---|---|---|
| Read($V_T$, $V_{dd}$, F, P) | 0 | -80 |
| | 1 | +80 |
| Read($V_{T1}$, $V_{dd}$, F, P) | 0 | -30 |
| | 1 | +35 |
| Read($V_{T2}$, $V_{dd}$, F, P) | 0 | -15 |
| | 1 | +10 |
| Read($V_T$, $V_{dd1}$, F, $P_1$) | 0 | +20 |
| | 1 | -20 |
| Read($V_T$, $V_{dd2}$, F, P) | 0 | -10 |
| | 1 | +15 |
| Read($V_T$, $V_{dd}$, $F_1$, P) | 0 | -15 |
| | 1 | +15 |
| Read($V_{T1}$, $V_{dd2}$, F, P) | 0 | -27 |
| | 1 | +33 |

FIG. 2

| Iteration | Parameter | Reading |
|---|---|---|
| 1 | normal read | $Read(V_T, V_{dd}, F, P)$ |
| 2 | normal read | $Read(V_T, V_{dd}, F, P)$ |
| 3 | modified $V_{T1}$ | $Read(V_{T1}, V_{dd}, F, P)$ |
| 4 | modified $V_{dd1}$ | $Read(V_T, V_{dd1}, F, P)$ |
| 5 | modified $V_{T2}$ | $Read(V_{T2}, V_{dd}, F, P)$ |

FIG. 3A

| Read-out data | Soft value |
|---|---|
| 0000 | −80+(−30)+20+(−15)=−105 |
| 0011 | −80+(−30)+(−20)+10=−120 |
| 0111 | −80+35+(−20)+10=−55 |
| 1010 | 80+(−30)+(−20)+(−15)=15 |
| 1111 | 80+35+(−20)+10=105 |

FIG. 3B

| Parameter | Read-out data | Update value |
|---|---|---|
| Read($V_T$) | 0 | +32 |
| | 1 | -32 |
| Read($V_{T1}$) | 0 | +95 |
| | 1 | 0 |
| Read($V_{T2}$) | 0 | 0 |
| | 1 | -95 |

FIG. 5C

| Read-out data | Soft value |
|---|---|
| 000 | 0+32+95=127 |
| 111 | (-32)+0+(-95)=-127 |
| 010 | +32+0+0=32 |

FIG. 5D

1st read :
data=00011010

| | | 0 |
| | | 0 |
| | | 0 |
| | | 1 |
| | | 1 |
| | | 0 |
| | | 1 |
| | | 0 | bit2  bit1  bit0

FIG. 9A

2nd read :
data=00111010

| | 0 | 0 |
| | 0 | 0 |
| | 1 | 0 |
| | 1 | 1 |
| | 1 | 1 |
| | 0 | 0 |
| | 1 | 1 |
| | 0 | 0 |

FIG. 9B

3rd read :
data=00001010

| 0 | 0 | 0 |
| 0 | 0 | 0 |
| 0 | 1 | 0 |
| 0 | 1 | 1 |
| 1 | 1 | 1 |
| 0 | 0 | 0 |
| 1 | 1 | 1 |
| 0 | 0 | 0 |

FIG. 9C

| 0 | 0 | 0 | → 127(strong 0) |
| 0 | 0 | 0 | → 127(strong 0) |
| 0 | 1 | 0 | → 32(weak 0) |
| 0 | 1 | 1 | → -32(weak 1) |
| 1 | 1 | 1 | → -127(strong 1) |
| 0 | 0 | 0 | → 127(strong 0) |
| 1 | 1 | 1 | → -127(strong 1) |
| 0 | 0 | 0 | → 127(strong 0) |

FIG. 9D

METHOD AND APPARATUS OF GENERATING A SOFT VALUE FOR A MEMORY DEVICE

BACKGROUND OF THE INVENTION

1. Field of the Invention

The present invention generally relates to reading a memory device, and more particularly to a method and apparatus of generating the soft value for a memory device.

2. Description of the Prior Art

Flash memory is a non-volatile solid state memory device that can be electrically erased and reprogrammed, and is a specific type of electrically erasable programmable read-only memory (EEPROM) device. Data bit read out of a solid state memory such as the flash memory has a binary value, that is, "0" or "1," which is commonly known as a hard value. However, the charge associated the data bit stored in the flash memory actually has an in-between value, which is commonly known as a soft value.

Error detection and correction is crucial in maintaining data reliability in a memory device such as the flash memory. This fact becomes more significant as either the density or the number of bits stored in each memory cell increases. Error correction code (ECC) is therefore commonly used to improve the reliability in the memory device.

The hard value of the read-out data is, nevertheless, insufficient or imprecise for detecting or correcting errors in the memory device. Therefore, a need has arisen to propose some schemes of generating the soft value that indicates the reliability or confidence of the read-out data from the memory device such as the flash memory. Accordingly, the generated soft value may be used to better estimate the in-between value of the stored charge, and be further used to effectively and precisely perform ECC decoding.

SUMMARY OF THE INVENTION

In view of the foregoing, it is an object of the embodiments of the present invention to provide a method and apparatus of generating the soft value for a memory device in an effective and simple manner. The generated soft value may then be used, for example, to better perform ECC decoding.

According to a proposed method of generating a soft value for a memory device, memory read-related parameters are set, and data are read out of the memory device according to the set parameters. The data reading is performed for pre-determined plural iterations, thereby obtaining the soft value according to the read-out data and the set parameters.

According to a proposed apparatus of generating a soft value for a memory device, a memory controller is configured to set memory read-related parameters and read data out of the memory device according to the set parameters. A buffer is configured to store the soft value corresponding to the read-out data. An arithmetic logic unit (ALU) is configured to receive the previous soft value from the buffer and an update value associated with the set parameters from the memory controller. The ALU accordingly generates the updated soft value that is then stored back into the buffer. The data reading is performed for pre-determined plural iterations.

According to another proposed apparatus of generating a soft value for a memory device, a memory controller is configured to set memory read-related parameters and read data out of the memory device according to the set parameters. A buffer is configured to store the read-out data, wherein the data reading is performed for pre-determined plural iterations. A converter is configured to receive the read-out data from the buffer and then convert into the corresponding soft value.

BRIEF DESCRIPTION OF THE DRAWINGS

FIG. 2 shows an exemplary lookup table (LUT) for updating the soft value based on the associated parameters and the read-out data;

FIG. 3A shows a reading example in which the flash memory is read five times;

FIG. 3B shows some read-out data and associated soft values according to the LUT of FIG. 2;

FIG. 5C shows an exemplary lookup table (LUT) for updating the soft value based on the associated parameters and the read-out data;

FIG. 5D shows some read-out data and associated soft values according to the LUT of FIG. 5C;

FIG. 9A through FIG. 9C exemplify three readings in sequence associated with FIG. 8A;

FIG. 9D shows some conversions of the read-out data of FIG. 9A-FIG. 9C;

DETAILED DESCRIPTION OF THE INVENTION

Figure 1:
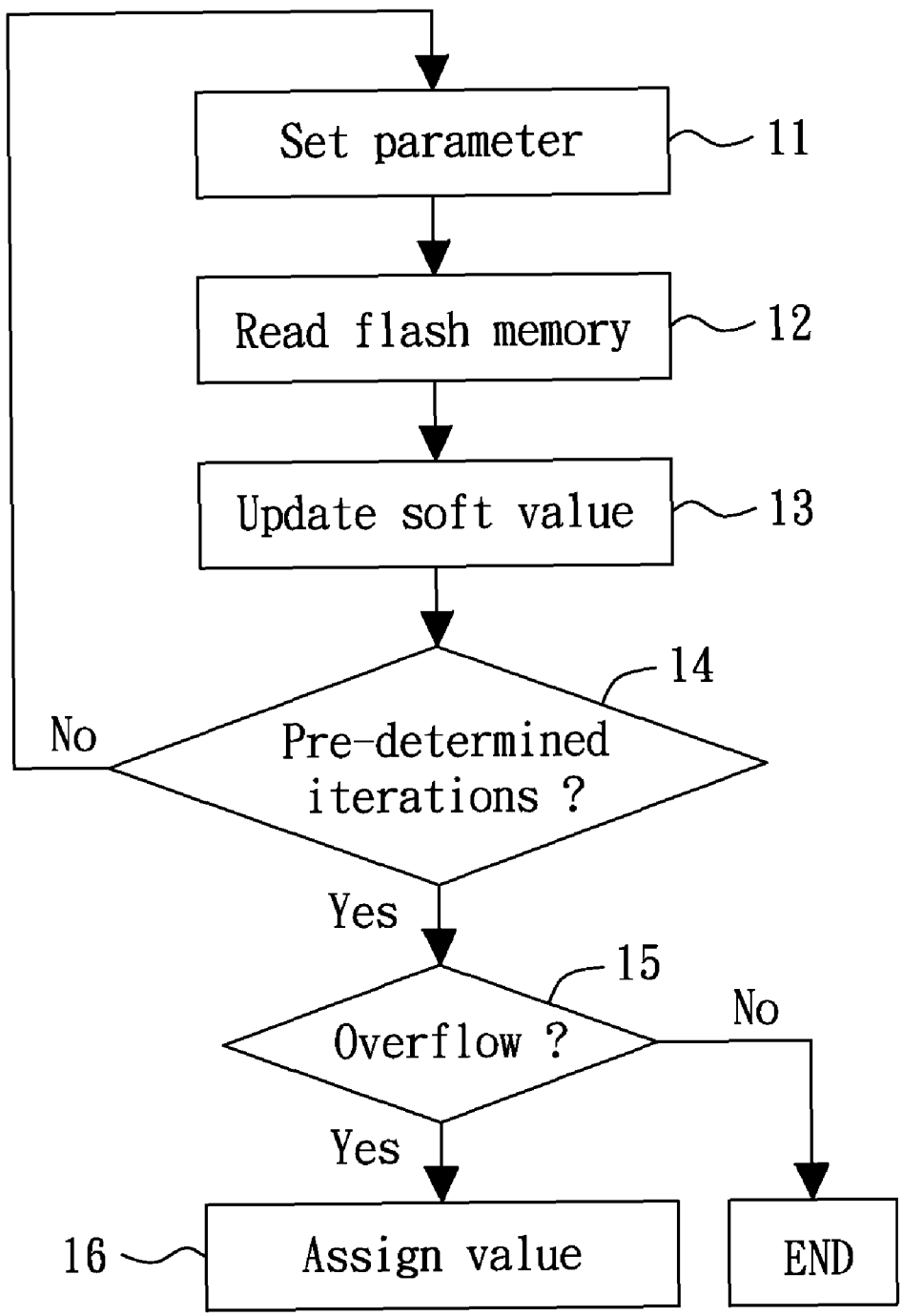
FIG. 1 is a flow diagram that illustrates a method of generating the soft value for a memory device according to the first embodiment of the present invention.

FIG. 1 is a flow diagram that illustrates a method of generating the soft value for a memory device according to the first embodiment of the present invention. The memory device may in general be any storage device or storage medium, and may specifically be a flash memory in the present embodiment. The flash memory is one type of a non-volatile solid state memory device that can be electrically erased and reprogrammed. The flash memory may be capable of storing a single bit of information in each memory cell of a single-level cell (SLC) flash memory, or be capable of storing two or more bits of information in each memory cell of a multi-level cell (MLC) flash memory.

According to the embodiment, in step 11, a parameter or parameters related to memory read are set or modified. The reading parameters related to the flash memory may be, but not limited to, read cycle time (or read frequency), voltage supplied to the flash memory, threshold voltage for reading the flash memory and reference voltage for memory sense amplifier. In another embodiment, the parameter may be further defined as a read source such as a page in the flash memory. In a particular example, different modified parameters may respectively refer to different pages of a pair page of the MLC flash memory, wherein the different pages correspond respectively to different bits of the MLC flash memory. Subsequently, in step 12, the flash memory is read according to the set parameters. Data read out of the flash memory have a hard value such as "0" or "1." Based on the read-out data and the reading parameters, a soft value is then updated in step 13. FIG. 2 shows an exemplary lookup table (LUT) for updating the soft value based on the associated parameters and the read-out data. For example, the soft value is decreased by 30 when the read-out data is "0" under the parameters ($V_{T1}$, $V_{dd}$, F, P), which represent a first modified threshold voltage, a normal supply voltage, a normal read frequency and a page P, respectively. The soft value, for example, is increased by 20 when the read-out data is "0" under the parameters ($V_T$, $V_{dd1}$, F, $P_1$), which represent the normal read threshold voltage, a first modified supply voltage, the normal read frequency and another page $P_1$ that is different from the page P, respectively. Although a fixed table is shown in the figure, it is worth noting that the LUT may be a dynamic table that varies adaptively.

The steps 11 through 13 are repeatedly performed until pre-determined iterations have reached (step 14). At that time, a resultant soft value is therefore obtained. Generally speaking, at least two iterations are to be performed. In one example, at least one parameter is modified throughout the iterations. In another example, the parameters are not modified throughout the iterations. In step 15, if the calculated value obtained in step 13 is greater or lower than what the soft value can possibly represent, that is, the calculated value overflows, the greatest or the lowest possible value is then assigned as the soft value (step 16). For example, as the range of an eight-bit soft value is between −127 and +127, +127 or the greatest possible value is then assigned as the soft value if the calculated value is greater than +127, and −127 or the lowest possible value is assigned as the soft value if the calculated value is lower than −127.

FIG. 3A shows a reading example in which the flash memory is read five times, in which a normal reading is firstly performed two times, followed by other three readings with modified parameters. FIG. 3B shows some read-out data and associated soft values according to the LUT of FIG. 2. For example, the read-out "1111" has a strong soft value of 105, while another read-out "1010" has a weak soft value of 15. The extra information provided by the resultant soft value may indicate reliability or confidence of the original data (e.g., charge) stored in the memory. This extra information may then be used, for example, to better perform error correction code (ECC) decoding.

The first embodiment illustrated in FIG. 1 updates the soft value on the run. That is, the soft value is updated for each reading. Alternatively, in the second embodiment, as shown in a flow diagram of FIG. 4, the soft value is only generated at the end after having performed steps 11 through 12 for pre-determined iterations. Specifically, the soft values of all possible combinations of the read-out data bits are pre-calculated beforehand in a manner similar to FIG. 3B, therefore resulting in a pre-determined complete LUT (step 10). After performing steps 11 through 12 for pre-determined iterations, the resultant soft value may then be generated according to the pre-determined LUT (step 13).

Figures 5A, 5B:
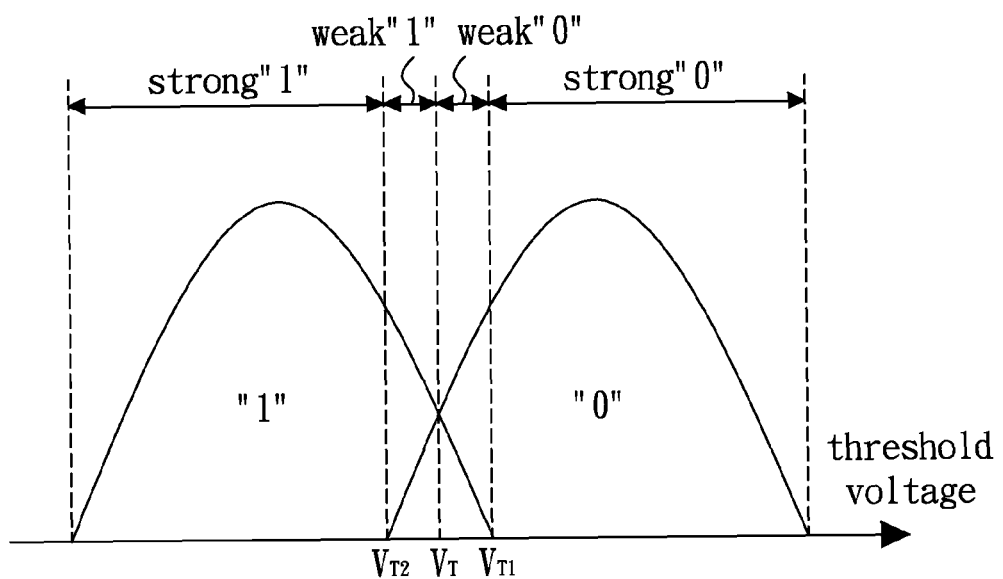
FIG. 5A shows another reading example in which the flash memory is read three times.
FIG. 5B shows a threshold voltage distribution associated with FIG. 5A.

FIG. 5A shows another reading example in which the flash memory is read three times, in which a normal reading is firstly performed, followed by other two readings with modified threshold voltage. FIG. 5B shows an associated threshold voltage distribution, which is divided by the normal threshold voltage $V_T$, the first modified threshold voltage $V_{T1}$ and the second modified threshold voltage $V_{T2}$ into four regions: strong "0" region, weak "0" region, weak "1" region and strong "1" region. FIG. 5C shows an exemplary lookup table (LUT) for updating the soft value based on the associated parameters and the read-out data. FIG. 5D shows some read-out data and associated soft values according to the LUT of FIG. 5C.

Figure 4:
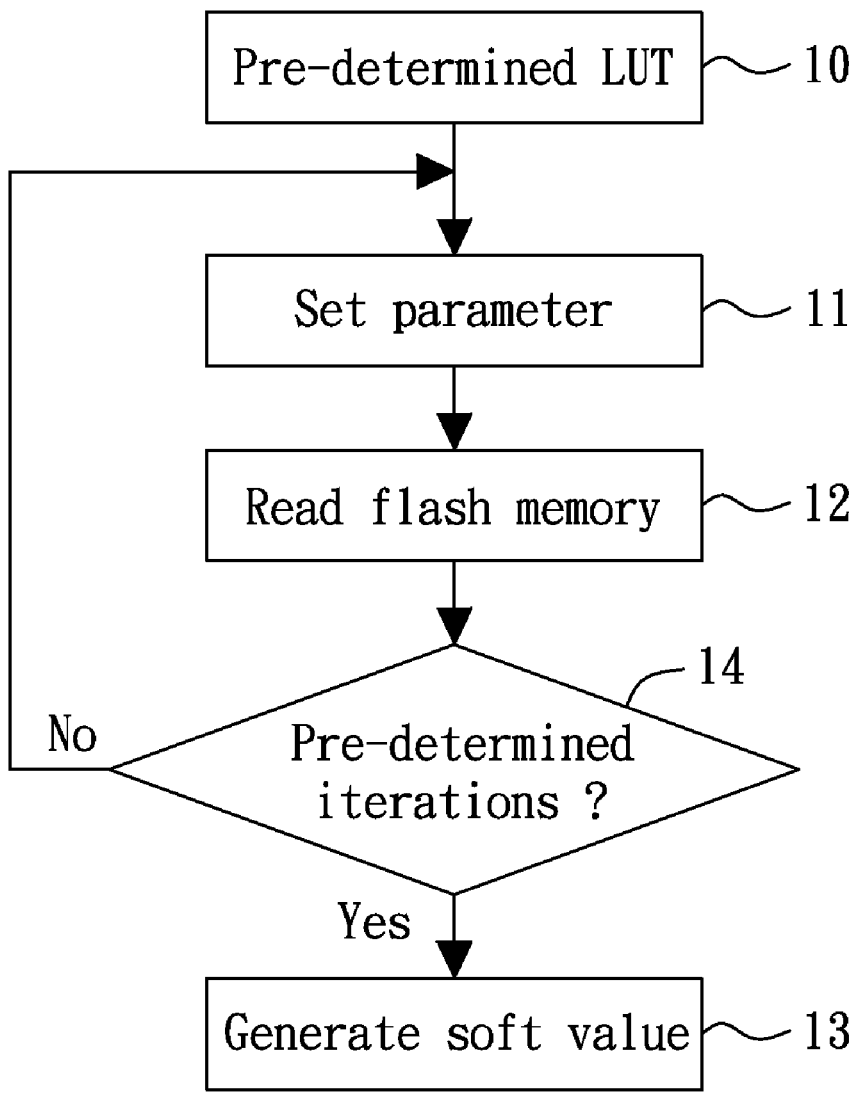
FIG. 4 is a flow diagram that illustrates a method of generating the soft value for a memory device according to the second embodiment of the present invention.

According to the two embodiments (i.e., FIG. 1 and FIG. 4), two error correction code (ECC) decoding schemes are proposed: a first scheme that follows the first embodiment (FIG. 1) and a second scheme that follows the second embodiment (FIG. 4).

First Scheme

Figure 6A:
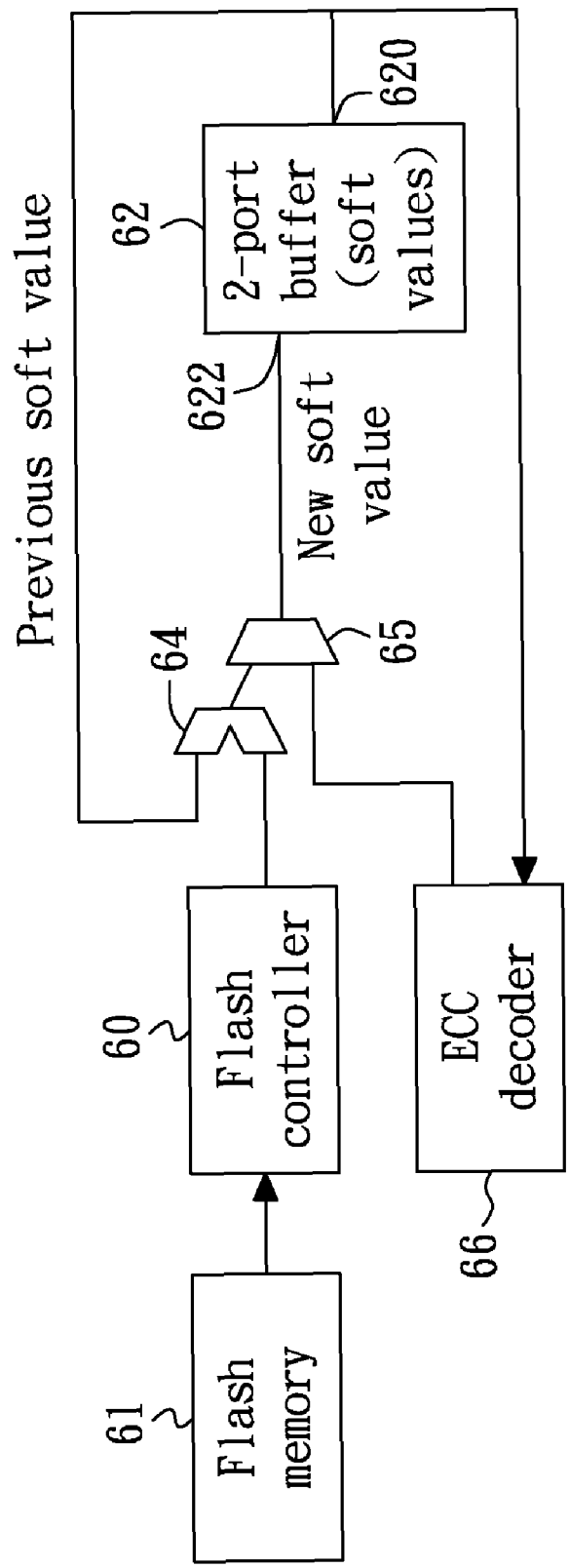
FIG. 6A shows a block diagram that illustrates an ECC decoding apparatus for a flash memory according to one embodiment of the first scheme.
Figure 6B:
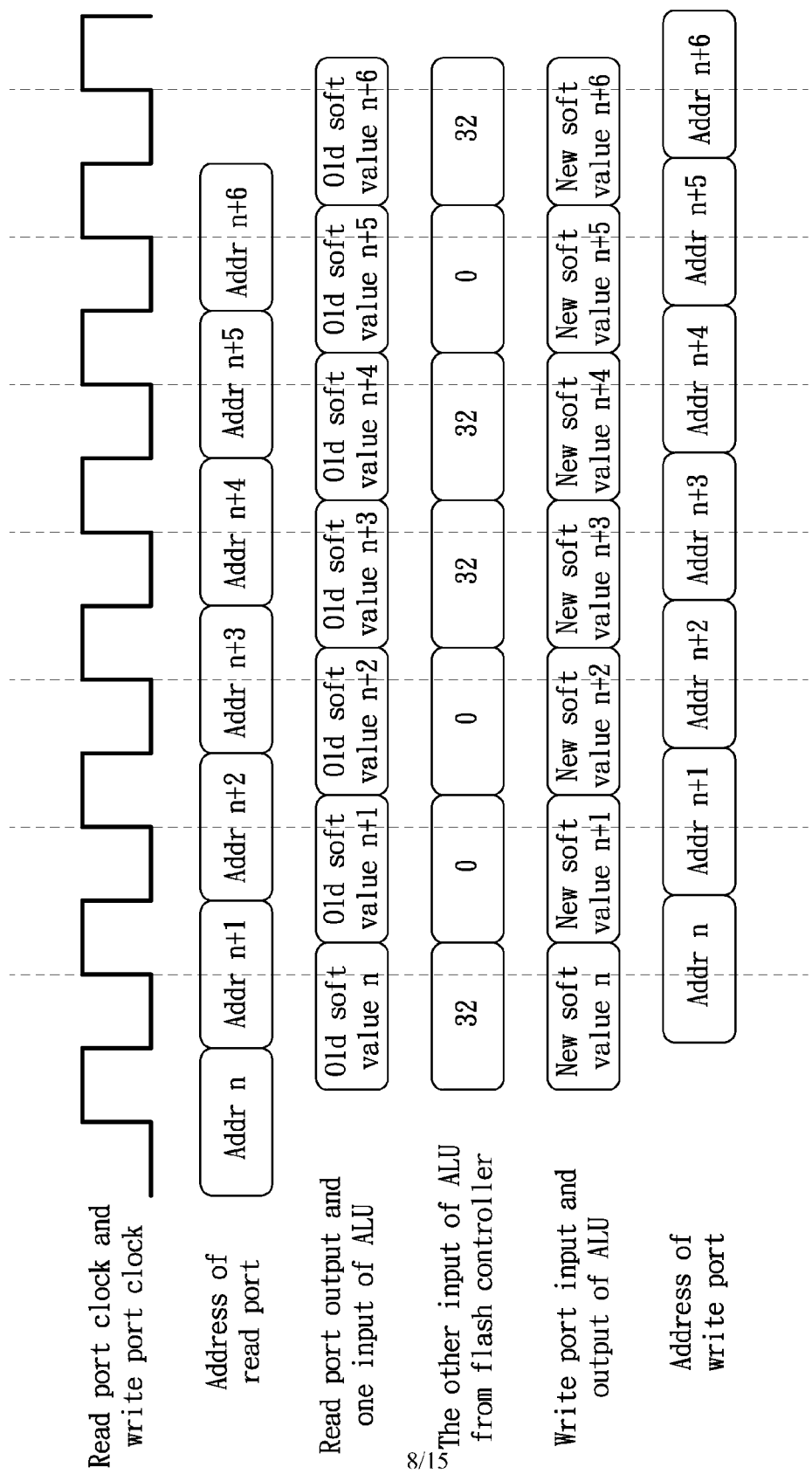
FIG. 6B shows some exemplary waveforms of FIG. 6A.

FIG. 6A shows a block diagram that illustrates an ECC decoding apparatus for a flash memory according to one embodiment of the first scheme. FIG. 6B shows some exemplary waveforms of FIG. 6A. In the embodiment, a flash controller 60 reads data out of a flash memory 61. A two-port buffer 62 is used to store soft values that correspond to the read-out data bits respectively. The two-port buffer 62 has a read port 620 and a write port 622, and is capable of reading data from the read port 620 and writing data into the write port 622 during the same cycle period. The soft value updating is performed as follows: old or previous soft value is read out from the read port 620 and then forwarded to one input of an arithmetic logic unit (ALU) 64 such as an adder. Another input of the ALU 64 receives update value (e.g., FIG. 5C) from the flash controller 60. The ALU 64 accordingly generates the new or updated soft value, which is selected and passed through a multiplexer 65 in a soft-value generating phase, and then stored back into the 2-port buffer 62 by writing the new soft value to the write port 622. In an ECC decoding phase, the multiplexer 65 is switched to receive the soft value for performing ECC decoding. It is noted that the ALU 64 may be a part of the flash controller 60. In other words, the ALU 64 and the flash controller 60 may be manufactured in the same integrated circuit. Moreover, all modules shown in FIG. 6A may be manufactured in the same integrated circuit. As shown in the waveform in FIG. 6B, the old soft value reading and the new soft value writing are performed during the same cycle period. After all the pre-determined iterations have been performed, the resultant final soft value may be retrieved by the ECC decoder 66 (from the read port 620) in order to perform ECC decoding.

Figure 7A:
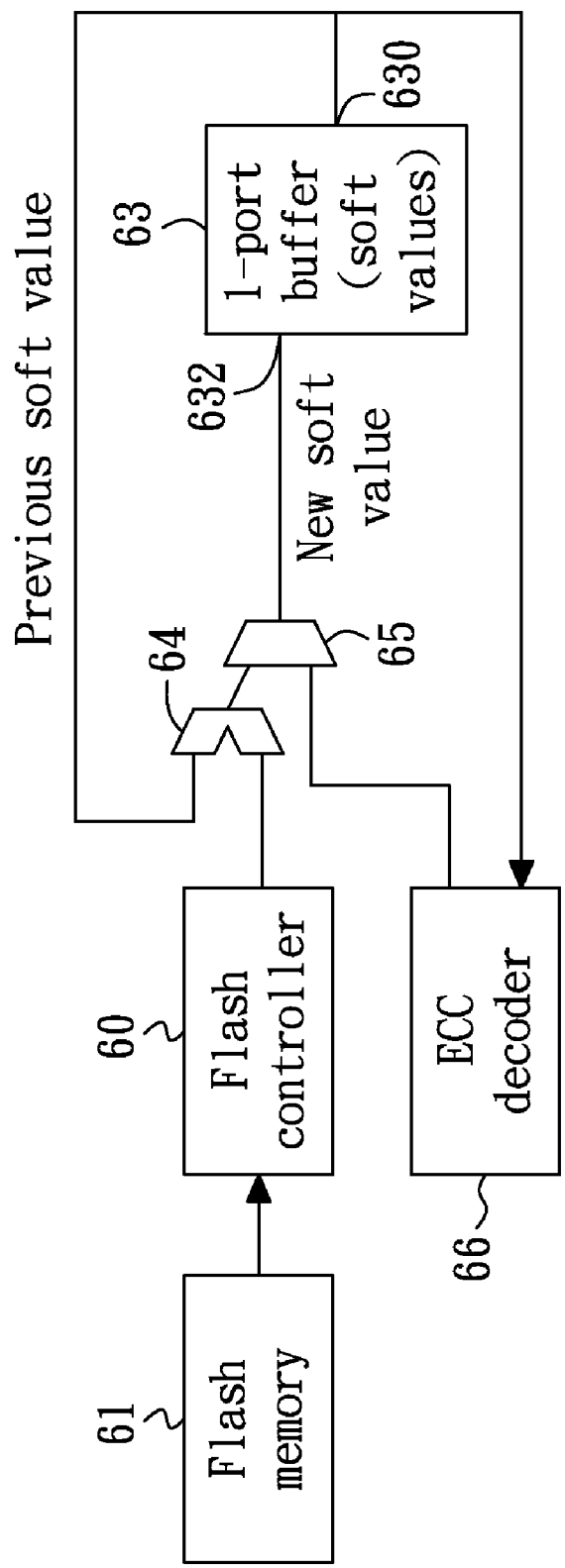
FIG. 7A shows a block diagram that illustrates an ECC decoding apparatus for a flash memory according to another embodiment of the first scheme.
Figure 7B:
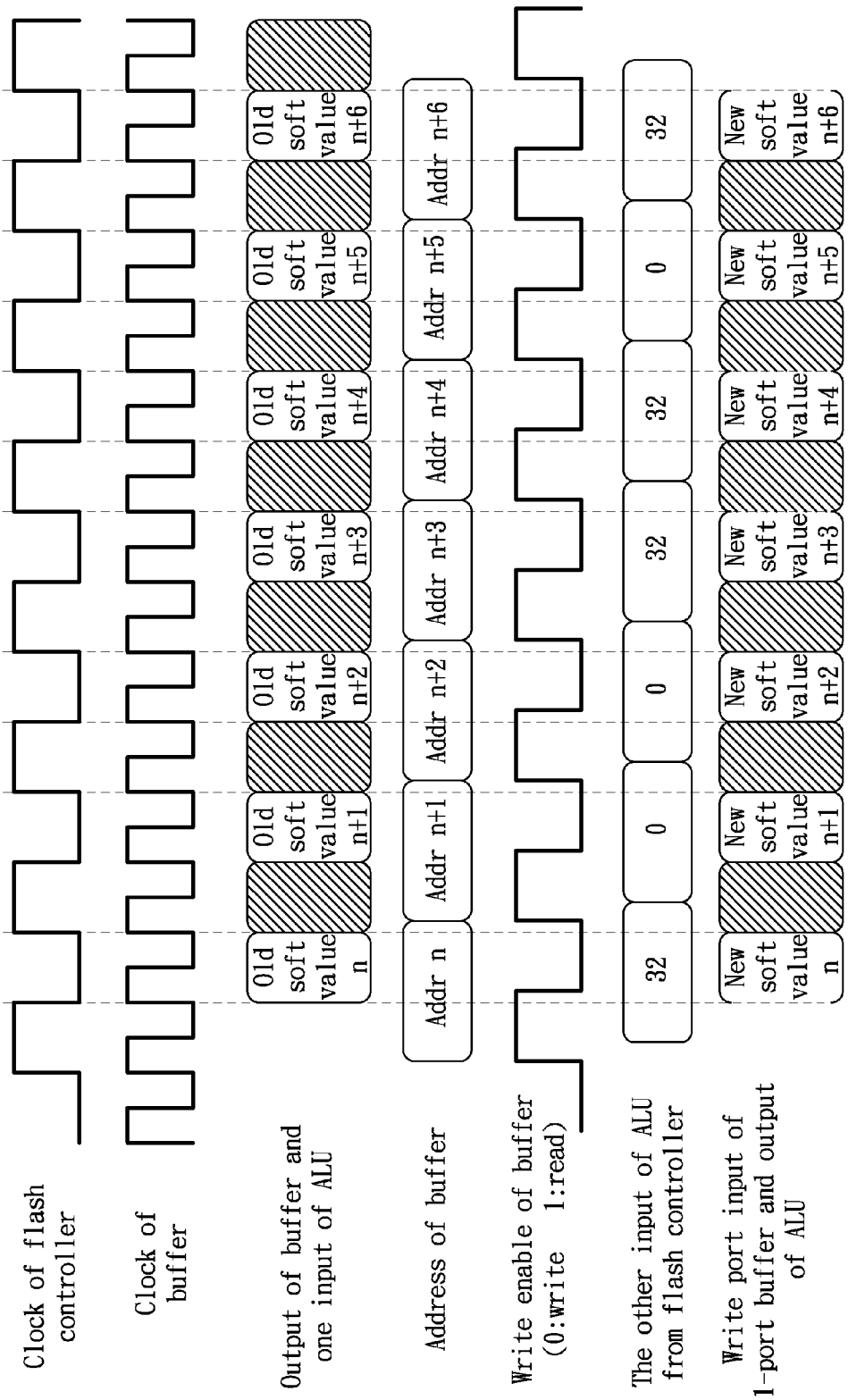
FIG. 7B shows some exemplary waveforms of FIG. 7A.

FIG. 7A shows a block diagram that illustrates an ECC decoding apparatus for a flash memory according to another embodiment of the first scheme. FIG. 7B shows some exemplary waveforms of FIG. 7A. The structure of FIG. 7A is similar to the structure of FIG. 6A, except that a one-port buffer 63 is used in FIG. 7A instead of the two-port buffer 62 in FIG. 6A. The one-port buffer 63 has a data-output bus 630 and a data-input bus 632. Reading data from the data-output bus 630 and writing data into the data-input bus 632 need be executed in sequence during a cycle period. For that purpose, the one-port buffer 63 has a clock at least two times faster than the clock of reading the flash memory 61 as shown in FIG. 7B. Accordingly, reading an old soft value may be performed in a first sub-cycle and writing a new soft value may be performed in a second sub-cycle.

Second Scheme

Figure 8A:
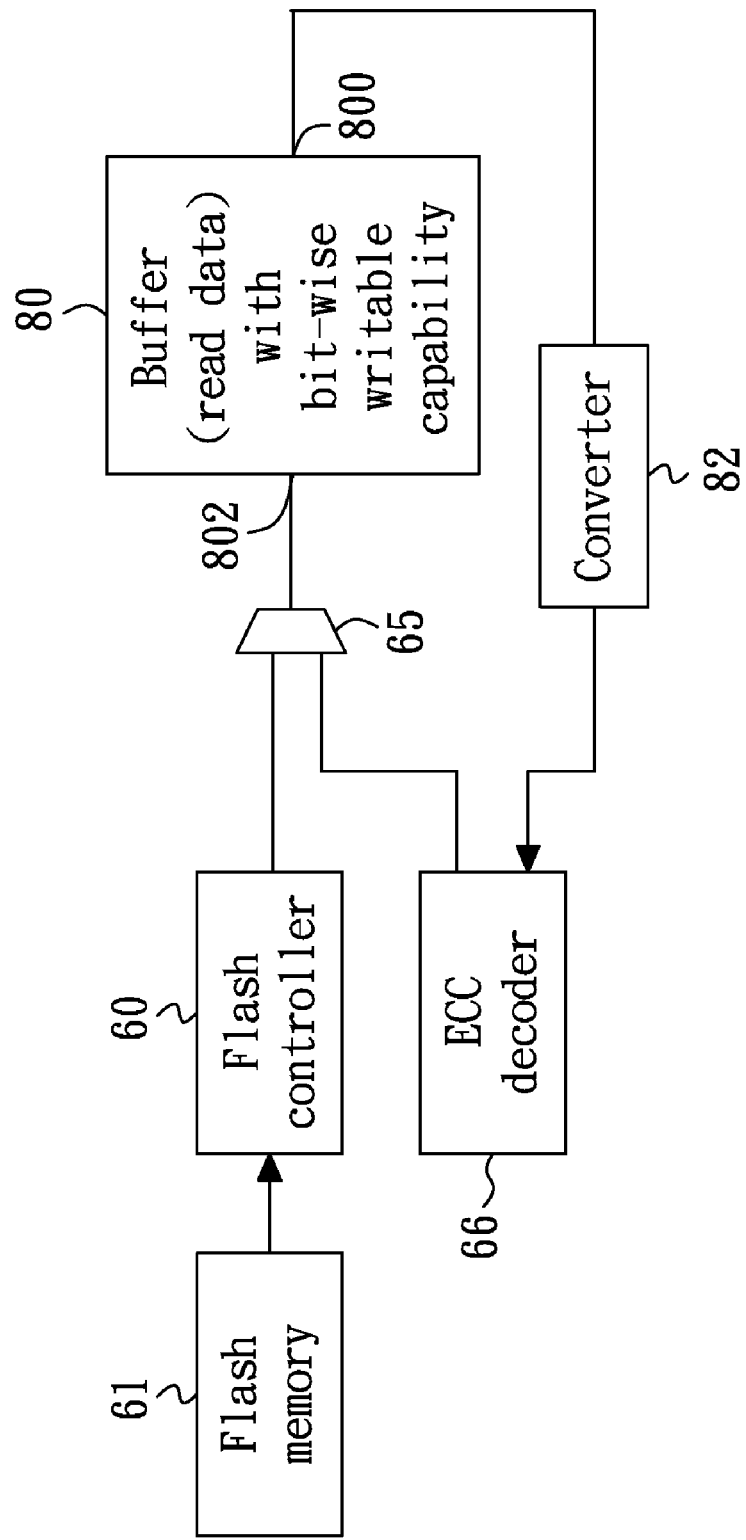
FIG. 8A shows a block diagram that illustrates an ECC decoding apparatus for a flash memory according to one embodiment of the second scheme.

FIG. 8A shows a block diagram that illustrates an ECC decoding apparatus for a flash memory according to one embodiment of the second scheme. The structure of FIG. 8A is similar to the structure of FIG. 6A or FIG. 7A, except that a buffer 80 is used to store read-out data from the flash memory 61. In a specific example, the read-out data are stored in different bit fields respectively in the buffer 80. FIG. 9A through FIG. 9C exemplify three readings in sequence. In the example, the first read-out data "00011010" (FIG. 9A) is stored in the bit-0 field of the buffer 80, the second read-out data "00111010" (FIG. 9B) is stored in the bit-1 field, and the third read-out data "00001010" (FIG. 9C) is stored in the bit-2 field. In other words, the buffer 80 in the embodiment need bit-wise writable capability in order to store the read-out data in sequence. The buffer 80 may be a bit-wise writable memory, also known as one-bit buffer, of which each bit in a word may be individually written.

After all read-out data have been read from the flash memory 61, the read-out data is retrieved from the buffer 80 via the read port 800, and is then forwarded to a converter 82 that converts the read-out data into corresponding soft value. The conversion may be performed according to a pre-calculated LUT such as that shown in FIG. 3B or FIG. 5D. FIG. 9D shows some conversions of the read-out data of FIG. 9A-FIG. 9C. The LUT may be pre-stored in a memory device or may be generated by a logic circuit. The content of the LUT may be fixed or dynamically varied.

Figure 8B:
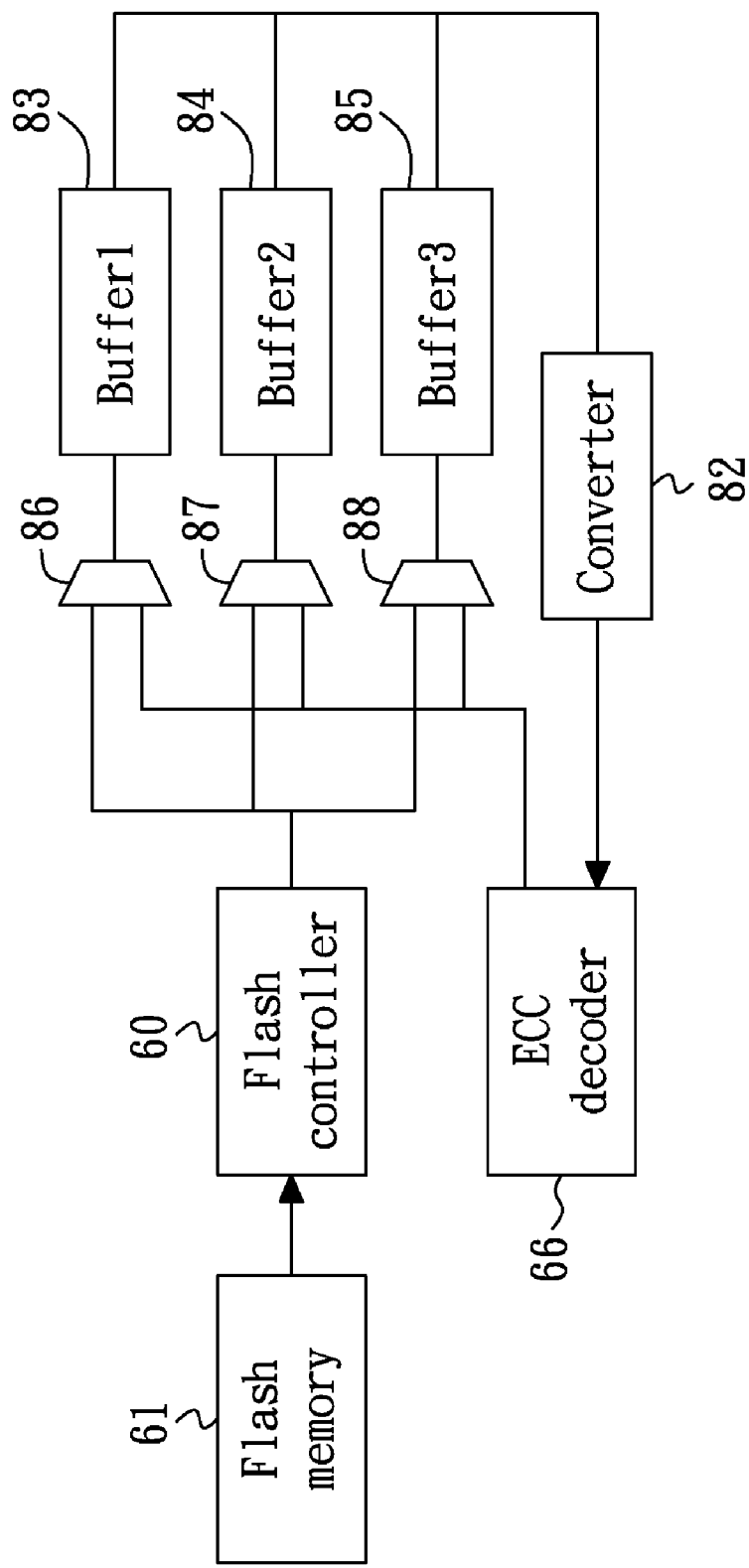
FIG. 8B shows a block diagram that illustrates an ECC decoding apparatus for a flash memory according to another embodiment of the second scheme.
Figure 9E:
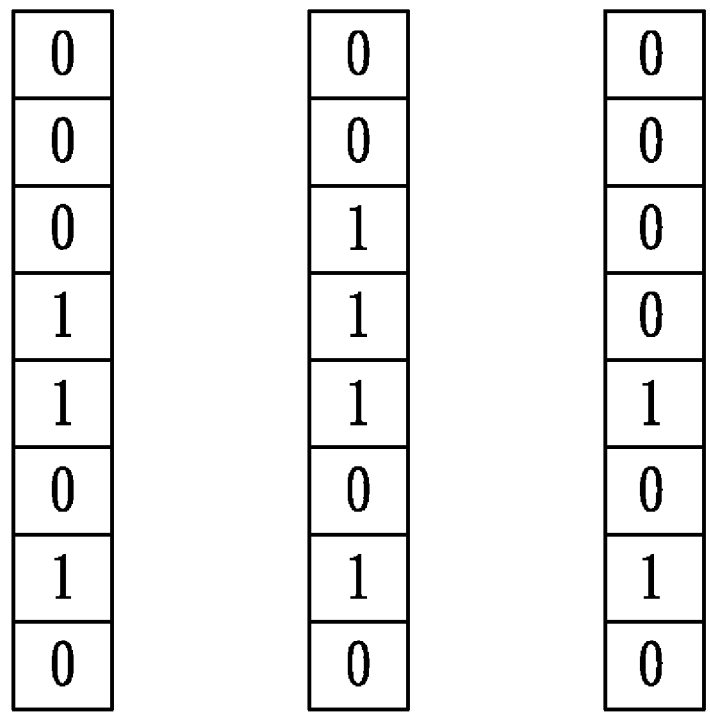
FIG. 9E shows how three readings are stored in the buffers of FIG. 8B.

FIG. 8B shows a block diagram that illustrates an ECC decoding apparatus for a flash memory according to another embodiment of the second scheme. The operation of FIG. 8B is similar to that of FIG. 8A with exceptions described below. In a soft-value generating phase, three buffers, e.g., buffer1 83, buffer2 84 and buffer3 85, are used to store read-out data of different readings respectively. In a specific example, as shown in FIG. 9E, the buffer1 83 stores the first read-out data, the buffer2 84 stores the second read-out data, and the buffer3 85 stores the third read-out data. Multiplexers (or selectors) 86, 87 and 88 could select the corresponding buffer to store the read-out data from the flash controller 60.

In an ECC decoding phase, the stored data are retrieved from the buffers 83, 84 and 85, and are then forwarded to the converter 82 that converts the read-out data into corresponding soft value. It is noted that if one buffer is used to store one read-out value (for example, the buffer1 83 is used to store the first reading, the buffer2 84 is used to store the second reading, and the buffer3 85 is used to store the third reading), a one-port buffer is adequate. However, if one buffer is used to store multiple read-out value (for example, the buffer1 83 is used to store the first and the second readings), a one-port buffer with a clock at least two times faster or a two-port buffer or a bit-wise buffer should be used if the buffer 83/84/85 is not bit-wise writable. On the other hand, if the buffer 83/84/85 is bit-wise writable, no two-port buffer or one-port buffer (having a clock at least two times faster) is required.

Figure 10:
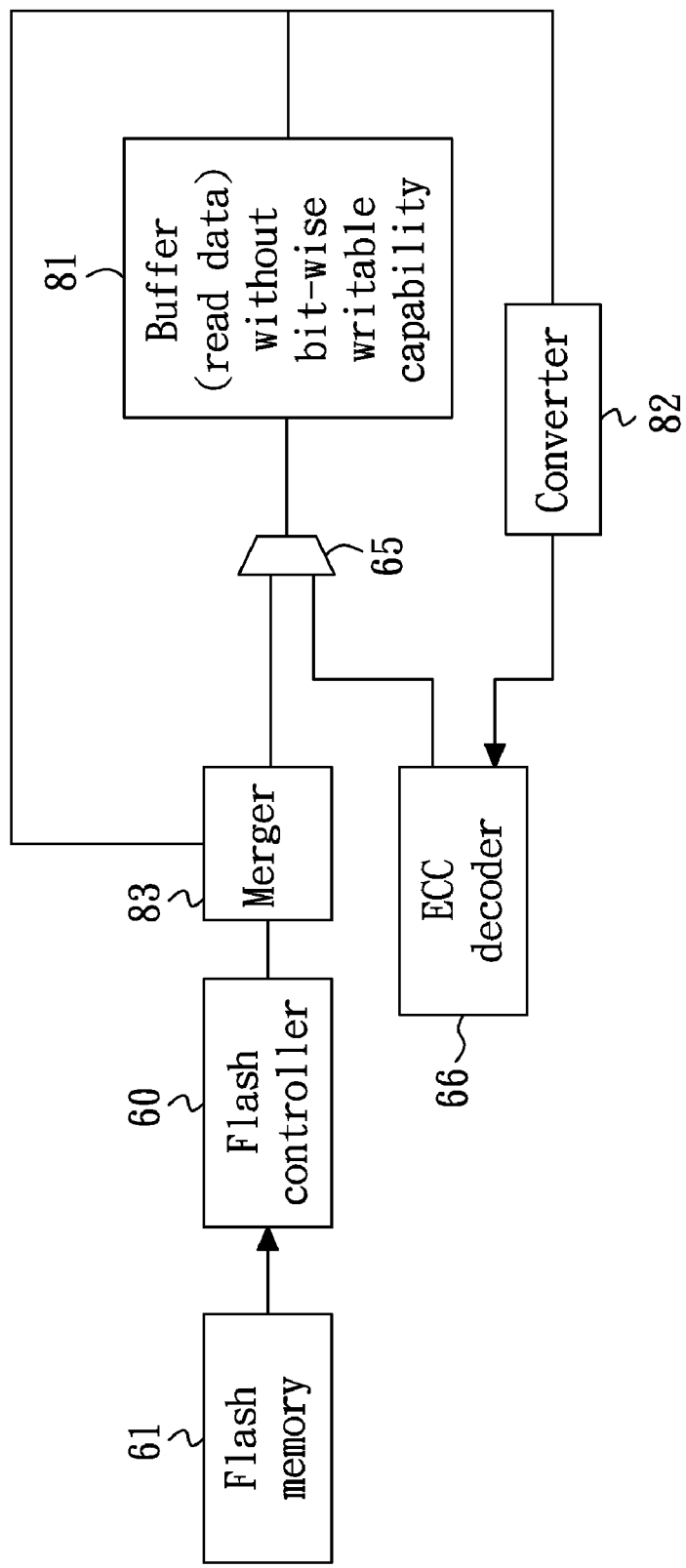
FIG. 10 shows a block diagram that illustrates an ECC decoding apparatus for a flash memory according to another embodiment of the second scheme.

FIG. 10 shows a block diagram that illustrates an ECC decoding apparatus for a flash memory according to another embodiment of the second scheme. The structure of FIG. 10 is similar to the structure of FIG. 8, except that the buffer 81 in the present embodiment does not possess the bit-wise writable capability as in FIG. 8. Accordingly, the present embodiment (FIG. 10) requires a merger 83 that is used to merge data bits in different bit-fields of the read-out data in order to arrive at the data structure exemplified in FIG. 9D. The buffer 81 may be a two-port buffer, or may be a one-port buffer that has a clock at least two times faster than the clock of reading the flash memory 61.

Although specific embodiments have been illustrated and described, it will be appreciated by those skilled in the art that various modifications may be made without departing from the scope of the present invention, which is intended to be limited solely by the appended claims.

What is claimed is:

1. A method of generating a soft value for a memory device, comprising:
   setting memory read-related parameters; and
   reading data out of the memory device according to the set parameters;
   wherein the data reading is performed for pre-determined plural iterations, thereby obtaining the soft value according to the read-out data and the set parameters; and
   wherein the soft value is updated during each said iteration according to the read-out data and the set parameters associated with said iteration, and the method further comprises a step of determining whether the soft value overflows after the pre-determined plural iterations have elapsed.

2. The method of claim 1, wherein the memory device is a flash memory.

3. The method of claim 1, wherein at least one of the parameters is modified throughout the pre-determined plural iterations.

4. The method of claim 1, wherein the parameter is one of the following: read cycle time, supply voltage to the memory device, threshold voltage for reading the memory device and reference voltage for a memory sense amplifier.

5. The method of claim 1, wherein the parameter is a read source.

6. The method of claim 5, wherein the read source is one page of a pair page of a multi-level cell flash memory.

7. The method of claim 1, wherein the soft value is updated according to a lookup table (LUT).

8. The method of claim 7, wherein the LUT is fixed or adaptively varied.

9. The method of claim 1, further comprising:
   pre-determining a lookup table (LUT) that maps all possible bit combinations of the read-out data into the corresponding soft values with respect to the set parameters.

10. The method of claim 9, wherein the soft value is generated according to the pre-determined LUT after the pre-determined plural iterations have elapsed.

11. The method of claim 9, wherein the pre-determined LUT is fixed or adaptively varied.

12. Apparatus of generating a soft value for a memory device, comprising:
   a memory controller configured to set memory read-related parameters and read data out of the memory device according to the set parameters;
   a buffer configured to store the soft value corresponding to the read-out data; and
   an arithmetic logic unit (ALU) configured to receive the previous soft value from the buffer and an update value associated with the set parameters from the memory controller, the ALU accordingly generating the updated soft value that is then stored back into the buffer;
   wherein the data reading is performed for pre-determined plural iterations; and
   wherein the buffer is a two-port buffer having a read port and a write port, and wherein the ALU is capable of reading an old soft value from the read port and writing a new soft value to the write port during a same cycle period.

13. The apparatus of claim 12, wherein the memory device is a flash memory.

14. The apparatus of claim 12, wherein at least one of the parameters is modified throughout the pre-determined plural iterations.

15. The apparatus of claim 12, wherein the parameter is one of the following: read cycle time, supply voltage to the memory device, threshold voltage for reading the memory device and reference voltage for a memory sense amplifier.

16. The apparatus of claim 12, wherein the parameter is a read source.

17. The apparatus of claim 16, wherein the read source is one page of a pair page of a multi-level cell flash memory.

18. The apparatus of claim 12, wherein the ALU is an adder.

19. The apparatus of claim 12, further comprising an error correction code (ECC) decoder configured to receive the soft value from the buffer in order to perform ECC decoding.

20. Apparatus of generating a soft value for a memory device, comprising:
   a memory controller configured to set memory read-related parameters and read data out of the memory device according to the set parameters;
   a buffer configured to store the soft value corresponding to the read-out data; and
   an arithmetic logic unit (ALU) configured to receive the previous soft value from the buffer and an update value associated with the set parameters from the memory controller, the ALU accordingly generating the updated soft value that is then stored back into the buffer;
   wherein the data reading is performed for pre-determined plural iterations; and
   wherein the buffer is a one-port buffer having a data-output bus and a data-input bus, the one-port buffer having a clock at least two times faster than a clock of reading the memory device, such that reading an old soft value from the data-output bus and writing a new soft value to the data-input bus are executed in sequence during a cycle period.

21. The apparatus of claim 20, wherein the memory device is a flash memory.

22. The apparatus of claim 20, wherein at least one of the parameters is modified throughout the pre-determined plural iterations.

23. The apparatus of claim 20, wherein the parameter is one of the following: read cycle time, supply voltage to the memory device, threshold voltage for reading the memory device and reference voltage for a memory sense amplifier.

24. The apparatus of claim 20, wherein the parameter is a read source.

25. The apparatus of claim 24, wherein the read source is one page of a pair page of a multi-level cell flash memory.

26. The apparatus of claim 20, wherein the ALU is an adder.

27. The apparatus of claim 20, further comprising an error correction code (ECC) decoder configured to receive the soft value from the buffer in order to perform ECC decoding.

28. Apparatus of generating a soft value for a memory device, comprising:
   a memory controller configured to set memory read-related parameters and read data out of the memory device according to the set parameters;
   at least one buffer configured to store the read-out data, wherein the data reading is performed for pre-determined plural iterations; and
   a converter configured to receive the read-out data from the buffer and then convert into the corresponding soft value;
   wherein said at least one buffer is not bit-wise writable, and includes a two-port buffer or a one-port buffer.

29. The apparatus of claim 28, wherein the memory device is a flash memory.

30. The apparatus of claim 28, wherein at least one of the parameters is modified throughout the pre-determined plural iterations.

31. The apparatus of claim 28, wherein the parameter is one of the following: read cycle time, supply voltage to the memory device, threshold voltage for reading the memory device and reference voltage for a memory sense amplifier.

32. The apparatus of claim 28, wherein the parameter is a read source.

33. The apparatus of claim 32, wherein the read source is one page of a pair page of a multi-level cell flash memory.

34. The apparatus of claim 28, wherein the converter comprises a lookup table (LUT) that maps all possible bit combinations of the read-out data into the corresponding soft values with respect to the set parameters.

35. The apparatus of claim 28, further comprising a merger configured to merge data bits in different bit fields of the read-out data before being stored into the buffer.

36. The apparatus of claim 28, further comprising an error correction code (ECC) decoder configured to receive the soft value from the converter in order to perform ECC decoding.

37. The apparatus of claim 28, wherein said at least one buffer has a clock the same speed as a clock of reading the memory device, or has the clock at least two times faster than the clock of reading the memory device.

38. Apparatus of generating a soft value for a memory device, comprising:
   a memory controller configured to set memory read-related parameters and read data out of the memory device according to the set parameters;
   at least one buffer configured to store the read-out data, wherein the data reading is performed for pre-determined plural iterations; and
   a converter configured to receive the read-out data from the buffer and then convert into the corresponding soft value;
   wherein the buffer has bit-wise writable capability to store data bits of the read-out data in different bit fields in the buffer.

39. The apparatus of claim 38, wherein the buffer is a bit-wise writable memory, of which each bit in a word may be individually written.

40. The apparatus of claim 38, wherein the memory device is a flash memory.

41. The apparatus of claim 38, wherein at least one of the parameters is modified throughout the pre-determined plural iterations.

42. The apparatus of claim 38, wherein the parameter is one of the following: read cycle time, supply voltage to the memory device, threshold voltage for reading the memory device and reference voltage for a memory sense amplifier.

43. The apparatus of claim 38, wherein the parameter is a read source.

44. The apparatus of claim 43, wherein the read source is one page of a pair page of a multi-level cell flash memory.

45. The apparatus of claim 38, wherein the converter comprises a lookup table (LUT) that maps all possible bit combinations of the read-out data into the corresponding soft values with respect to the set parameters.

46. The apparatus of claim 38, further comprising an error correction code (ECC) decoder configured to receive the soft value from the converter in order to perform ECC decoding.

47. Apparatus of generating a soft value for a memory device, comprising:

a memory controller configured to set memory read-related parameters and read data out of the memory device according to the set parameters;

at least one buffer configured to store the read-out data, wherein the data reading is performed for pre-determined plural iterations; and a converter configured to receive the read-out data from the buffer and then convert into the corresponding soft value;

wherein said at least one buffer includes a plurality of buffers used to store the read-out data of different readings respectively.

48. The apparatus of claim 47, wherein the memory device is a flash memory.

49. The apparatus of claim 47, wherein at least one of the parameters is modified throughout the pre-determined plural iterations.

50. The apparatus of claim 47, wherein the parameter is one of the following: read cycle time, supply voltage to the memory device, threshold voltage for reading the memory device and reference voltage for a memory sense amplifier.

51. The apparatus of claim 47, wherein the parameter is a read source.

52. The apparatus of claim 51, wherein the read source is one page of a pair page of a multi-level cell flash memory.

53. The apparatus of claim 47, wherein the converter comprises a lookup table (LUT) that maps all possible bit combinations of the read-out data into the corresponding soft values with respect to the set parameters.

54. The apparatus of claim 47, further comprising an error correction code (ECC) decoder configured to receive the soft value from the converter in order to perform ECC decoding.

* * * * *